(12) United States Patent
Norman

(10) Patent No.: US 7,619,945 B2
(45) Date of Patent: Nov. 17, 2009

(54) MEMORY POWER MANAGEMENT

(75) Inventor: Robert Norman, Blaine, WA (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 221 days.

(21) Appl. No.: 11/506,385

(22) Filed: Aug. 18, 2006

(65) Prior Publication Data

US 2008/0043559 A1 Feb. 21, 2008

(51) Int. Cl.
*G11C 5/14* (2006.01)
(52) U.S. Cl. ............... 365/226; 365/63; 365/189.09
(58) Field of Classification Search ............ 365/226, 365/63, 189.09, 189.03, 185.23, 185.33, 365/185.14, 230.03
See application file for complete search history.

(56) References Cited

U.S. PATENT DOCUMENTS

| | | | |
|---|---|---|---|
| 3,886,577 A | 5/1975 | Buckley | |
| 5,296,716 A | 3/1994 | Ovshinsky et al. | |
| 5,612,913 A * | 3/1997 | Cappelletti et al. | 365/185.12 |
| 5,835,396 A | 11/1998 | Zhang | |
| 6,034,882 A | 3/2000 | Johnson et al. | |
| 6,084,800 A * | 7/2000 | Choi et al. | 365/185.23 |
| 6,204,139 B1 | 3/2001 | Liu et al. | |
| 6,473,332 B1 | 10/2002 | Ignatiev et al. | |
| 6,487,106 B1 | 11/2002 | Kozicki | |
| 6,531,371 B2 | 3/2003 | Hsu et al. | |
| 6,614,699 B2 * | 9/2003 | Tanzawa | 365/189.11 |
| 6,657,888 B1 | 12/2003 | Doudin et al. | |
| 6,731,528 B2 | 5/2004 | Hush et al. | |
| 6,753,561 B1 | 6/2004 | Rinerson et al. | |
| 6,788,576 B2 | 9/2004 | Roizin | |
| 6,807,088 B2 | 10/2004 | Tsuchida | |
| 6,825,489 B2 | 11/2004 | Kozicki | |
| 6,836,421 B2 | 12/2004 | Rinerson et al. | |
| 6,856,536 B2 | 2/2005 | Rinerson et al. | |
| 7,002,197 B2 | 2/2006 | Perner et al. | |
| 7,218,984 B1 | 5/2007 | Bayat et al. | |
| 7,317,630 B2 * | 1/2008 | Telecco et al. | 365/63 |
| 7,460,385 B2 * | 12/2008 | Gruber et al. | 365/51 |
| 2002/0028541 A1 * | 3/2002 | Lee et al. | 438/149 |
| 2003/0132456 A1 | 7/2003 | Miyai et al. | |
| 2003/0151959 A1 * | 8/2003 | Tringali et al. | 365/200 |
| 2004/0141369 A1 | 7/2004 | Noguchi | |
| 2005/0135148 A1 | 6/2005 | Chevallier et al. | |
| 2005/0151156 A1 | 7/2005 | Wu et al. | |
| 2006/0050598 A1 | 3/2006 | Rinerson et al. | |
| 2006/0164882 A1 | 7/2006 | Norman | |
| 2006/0171200 A1 | 8/2006 | Rinerson et al. | |
| 2007/0223282 A1 * | 9/2007 | Sarig | 365/185.23 |
| 2008/0173975 A1 | 7/2008 | Chen et al. | |

OTHER PUBLICATIONS

U.S. Appl. No. 11/449,105, filed Jun. 8, 2006, Robert Norman.
U.S. Appl. No. 11/478,163, filed Jun. 28, 2006, Robert Norman.

(Continued)

*Primary Examiner*—Dang T Nguyen

(57) ABSTRACT

Memory power management is described. A non-volatile memory array is provided, the array including separately controlled memory blocks. At least two charge pumps are coupled to the array, the charge pumps being configured to provide at least two voltages. Logic is configured to control how the voltages are delivered to the memory blocks.

9 Claims, 8 Drawing Sheets

OTHER PUBLICATIONS

U.S. Appl. No. 60/536,115, filed Jan. 13, 2004, Wu et al.

A. Baikalov, et al, "Field-driven hysteretic and reversible resistive switch at the Ag-Pr0.7Ca0.3MnO3 interface" Applied Physics Letters, vol. 83, No. 5, Aug. 4, 2003, pp. 957-959.

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139-141.

A. Sawa, et al, "Hysteretic current-volyage characteristics and resisitance switching at a rectifying $Ti/Pr_{0.7}Ca_{0.3}MnO_3$ interface" Applied Physics Letters, vol. 85, No. 18, Nov. 1, 2004, pp. 4073-4075.

C. Rossel, G.I. Meijer, D. Brémaud, D. Widmer, "Electrical current distribution across a metal-insulator-metal structure during bistable switching," Journal of Applied Physics, vol. 90, No. 6, Sep. 15, 2001, pp. 2892-2898.

David Oxley, "Memory Effects in Oxide Films" in Oxides and Oxide Films, vol. 6, pp. 251-325 (Chapter 4) (Ashok. K. Vijh ed., Marcel Drekker) (1981).

J.G. Simmons and R.R. Verderber, "New Conduction and Reversible Memory Phenomena in Thin Insulating Films," Proc. Roy. Soc. A., 301 (1967), pp. 77-102.

Liu et al., "A New Concept for Non-Volatile Memory: The Electric-Pulse Induced Resistive Change Effect in Colossal Magnetoresistive Thin Films," Non-Volatile Memory Technology Symposium, Nov. 7, 2001, pp. 1-7.

Liu et al., "Electric-pulse-induced reversible resistance change effect in magnetoresistive films," Applied Physics Letters, vol. 76, No. 19, May 8, 2000, pp. 2749-2751.

R.E. Thurstans and D.P. Oxley, "The Electroformed metal-insulator-metal structure: A comprehensive model," J. Phys. D.: Appl. Phys. 35 (2002), Apr. 2, 2002, pp. 802-809.

Y. Watanabe, J.G. Bednorz, A. Bietsch, Ch. Gerber, D. Widmer, A. Beck, "Current-driven insulator-conductor transition and nonvolatile memory in chromium-doped SrTiO3 single crystals," Applied Physics Letters, vol. 78, No. 23, Jun. 4, 2001, pp. 3738-3740.

R. Oligschlaeger, R. Waser, R. Meyer, S. Karthäuser, R. Dittmann, "Resistive switching and data reliability of epitaxial (Ba,Sr)TiO thin films," Applied Physics Letters, 88 (2006), 042901.

S. Lai, T. Lowrey, "OUM—A 180 nm nonvolatile memory cell element technology for standalone and embedded applications," IEEE International Electron Device Meeting, Technical Digest, 803 (2001).

J. Mizusaki J, Y. Yonemura, H. Kamata, K. Ohyama, N. Mori, H. Takai, H. Tagawa, M. Dokiya, K. Naraya, T. Sasamoto, H. Inaba, T. Hashimoto, "Electronic conductivity, Seebeck coefficient, defect and electronic structure of nonstoichiometric $La_{1-x}Sr_xMnO_3$," Solid State Ionics 132, 167 (2000).

Zhao Y. G. ; Rajeswari M. ; Srivastava R. C. ; Biswas A. ; Ogale S. B. ; Kang D. J. ; Prellier W. ; Zhiyun Chen ; Greene R. L. ; Venkatesan T., "Effect of oxygen content on the structural, transport, and magnetic properties of $La_{1-delta}Mn_{1-delta}O_3$ thin films," Journal of Applied Physics, vol. 86, No. 11, Dec. 1999, pp. 6327-6330.

J. R. Stetter, W. R. Penrose, S. Yao, "Sensors, Chemical Sensors, Electrochemical Sensors, and ECS," Journal of The Electrochemical Society, 150 (2), S11-S16 (2003).

B. C. H. Steele, A. Heinzel, "Materials for Fuel-Cell Technologies," Nature 414, Nov. 2001, pp. 345-352.

A. Reller, J. M. Thomas, D. A. Jefferson, M. K. Uppal, "Superstructures Formed by the Ordering of Vacancies in a Selective Oxidation Catalyst: Grossly Defective $CaMnO_3$," Proceedings of the Royal Society of London, vol. 394, No. 1807 Aug. 1984, pp. 223-241.

A. J. Millis, "Cooperative Jahn-Teller effect and electron-phonon coupling in $La_{1-\chi}A_\chi MnO_3$," Phys. Rev. B 53, 8434-8441 (1996).

\* cited by examiner

MEMORY POWER MANAGEMENT

FIELD OF THE INVENTION

The present invention relates generally to semiconductors and memory technology. More specifically, memory power management is described.

BACKGROUND OF THE INVENTION

Conventional memory systems (e.g., storage systems, disk drives, hard disks, memory chips, memory devices, and the like) are fabricated using technologies such as static random access memory (SRAM), dynamic random access memory (DRAM), or non-volatile implementations (e.g., Flash). However, conventional memory systems are problematic because of the need to increase functionality while reducing die sizes.

Memory controllers, logic circuitry, or other components in conventional implementations often require large die sizes in order to accommodate various components or circuits. Conventional implementations often use components such as multiple processors, buffer memory, error correction code (ECC), and direct memory access (DMA) circuits for fast movement of data. Demands for increasingly complex, faster, and larger memory arrays require chips with greater functionality, but smaller die sizes. However, conventional implementations use large circuit patterns that require large die sizes. Due to conventional circuit patterns and component design, power requirements and heat generation are high, which lead to memory system failures and errors. Another issue with conventional implementations is the amount of driving voltage required to program and erase memory cells or elements ("elements") in conventional memory arrays.

In conventional implementations, driving voltages are generated by circuits known as charge pumps. Charge pumps may be used to receive an input voltage, transfer power using one or more capacitors, and generate an output or driving voltage that is larger or smaller than the input voltage. An output voltage is stabilized and "driven" to a desired voltage level in order to cause a program operation (e.g., read, write, and erase) to occur in elements of a memory array. The voltages generated by conventional charge pumps are limited by factors such as the amount of available current, the size of capacitors used in a charge pump circuit, and the quantity of charge pumps used to generate voltages for the programmable sequences. In conventional memory systems, charge pumps are often implemented using circuitry that can generate large output voltages, thus requiring more or larger capacitors, which are used to store and transfer voltages required to perform a programmable sequence (e.g., read, write, erase). Capacitors in conventional charge pump circuits are designed to support large voltages or stepped up voltages, which requires large die sizes. Further, as conventional memory arrays increase in capacity, the size of conventional charge pumps and the required amount of driving voltages also increase. Combined with conventional charge pumps, conventional memory systems are difficult and expensive to manufacture and operate.

FIG. 1 illustrates a conventional memory system. In conventional implementations, system 100 includes charge pump 102, switches 104-112, and memory blocks 114-120. Here, a functional perspective is shown and in conventional implementations, components 102-120 are formed on the surface of a substrate. Charge pump 102 is a conventional circuit implementation used to step up a voltage which is passed through one of switches 104-112 in order to select an element (not shown) in one of memory blocks 114-120. Voltages from charge pump 102 are large and used for programmable sequences in memory blocks 114-120. However, large voltages generated by charge pump 102 can create disturbances or "disturb effects" in surrounding elements other than those desired. A disturb effect results from the generation of a large voltage by charge pump 102, which changes the resistive state or inadvertently programs or erases a non-selected element. Conventional memory systems suffer from large charge pump sizes and outputs, which require large die sizes, create error and disturb effects, and increase fabrication and operational expenses.

Continuing efforts are being made to improve memory systems.

BRIEF DESCRIPTION OF THE DRAWINGS

Various embodiments of the invention are disclosed in the following detailed description and the accompanying drawings.

Figure 1:
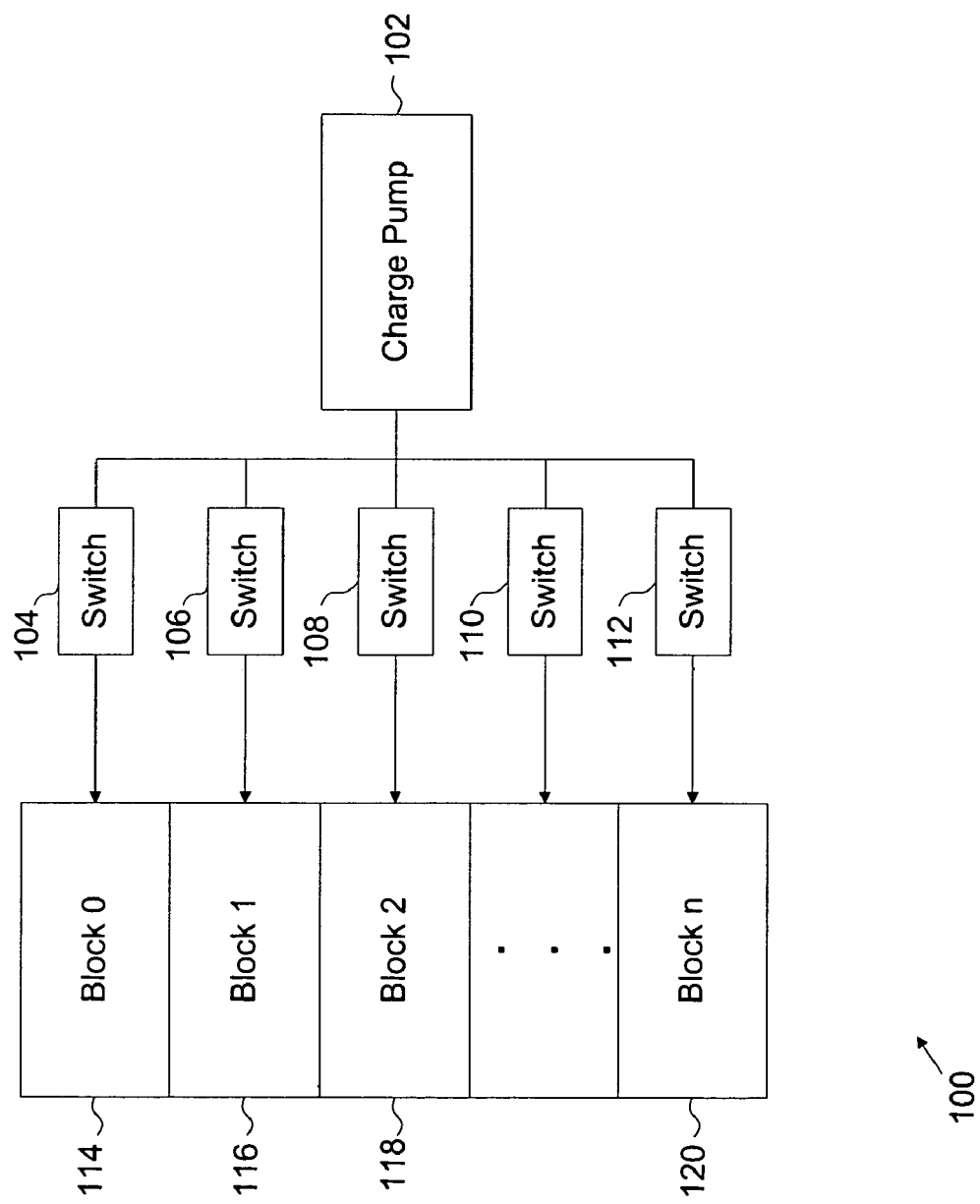
FIG. 1 illustrates a conventional memory system.

It is to be understood that the depictions in the FIGs are not necessarily to scale. Although various examples of the invention are disclosed in the accompanying drawings, the invention is not limited to those specific examples.

DETAILED DESCRIPTION

The invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Memory systems may be implemented using non-volatile third dimension memory arrays coupled to logic and charge pump circuitry to reduce die size, allow for reduced power requirements, and increased accesses for programmable sequences. A memory is "third dimension memory" when it is fabricated above other circuitry components, the components usually including a silicon substrate, polysilicon layers and, typically, metallization layers. By using non-volatile third dimension memory arrays, memory systems may be vertically-configured to reduce die size and not sacrifice overall chip functionality.

U.S. patent application Ser. No. 11/095,026, filed Mar. 30, 2005, U.S. Published Application 2006/0171200, and titled "Memory Using Mixed Valence Conductive Oxides," hereby incorporated by reference in its entirety and for all purposes, describes non-volatile third dimension memory cells that can be arranged in a cross point array. The application describes a two terminal memory element that changes conductivity when exposed to an appropriate voltage drop across the two terminals. The memory element includes an electrolytic tunnel barrier and a mixed valence conductive oxide. A voltage drop across the electrolytic tunnel barrier causes an electrical field within the mixed valence conductive oxide that is strong enough to move oxygen ions out of the mixed valence conductive oxide and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry). Additionally, two-terminal memory elements can be arranged in a cross point array such that one terminal is electrically coupled with an x-direction line and the other terminal is electrically coupled with a y-direction line. A stacked cross point array consists of multiple cross point arrays stacked upon one another, sometimes sharing x-direction and y-direction lines between layers, and sometimes having isolated lines. Both single-layer cross point arrays and stacked cross point arrays may be arranged as third dimension memories.

Memory arrays may be implemented using layers of memory elements that may be used in blocks or sub-blocks to store data. By utilizing third dimension memory, driving voltage requirements may be met by using multiple, smaller charge pumps. Further, multiple, simultaneous accesses of memory elements in a memory array may be performed. While various types and designs of charge pump circuits may be used, the implementation of multiple, smaller charge pumps in a third dimension memory allows for die size to be reduced while improving chip capabilities, including faster access times for performing multiple, simultaneous programmable sequences.

Figure 2A:
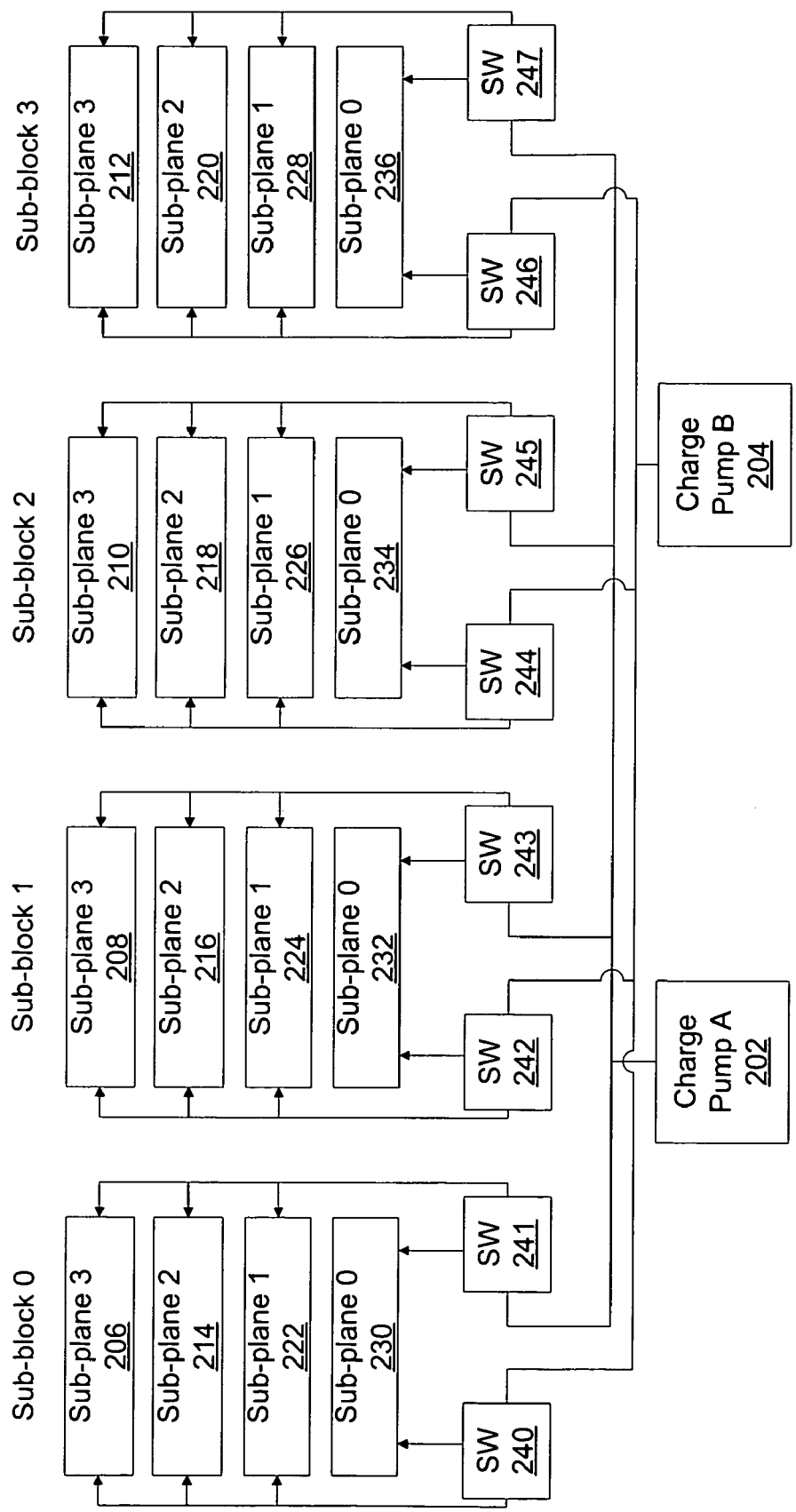
FIG. 2A illustrates an exemplary memory power management system.

FIG. 2A illustrates an exemplary memory power management system. Here, system 200 includes charge pumps 202-204, physical partitions 206-236, and switches 240-247. In some examples, switches 240-247 are grouped in pairs, each member of a pair of switches gating voltages to a partition based on either an X or Y coordinate. By referencing a memory element using X and Y coordinates, a programmable sequence may be performed at a desired location in a memory array, whether in a block, sub-block, plane, sub-plane, or any other type of partition. For example, X and Y coordinate switches 242 and 243 gate driving voltages from charge pumps 202-204 to one or more locations within physical partitions 216 and 208, which lie on sub-planes 2 and 3 of sub-block 1 of the memory array. In this example, physical partitions 206-236 represent a plurality of conductive array lines. Memory elements (not shown) are located at the intersection of conductive array lines in adjacent sub-planes. Together physical partitions 216 and 208 selectively address memory elements at the intersections of activated conductive array lines within the physical partitions 216 and 208. Charge pumps 202-204 generate voltages that are used to perform programmable sequences on memory elements electrically connected to physical partitions 206-236. In some examples, physical partitions 206-236 may be grouped together in sub-planes (e.g., sub-planes 0, 1, 2, 3, and the like) and sub-blocks (e.g., memory sub-blocks 0, 1, 2, 3, and the like). Different sub-blocks may be grouped together as blocks of a memory array. Adjacent sub-planes and the memory elements between them constitute a memory plane ("plane" or "memory layer"). In some embodiments, memory elements are located between every sub-plane such that a physical partition may drive two sub-planes of memory (e.g., one plane includes sub-planes 0 and 1, another plane includes sub-planes 1 and 2, another plane includes sub-planes 2 and 3, and the like). In other embodiments, physical partitions may drive a single sub-plane of memory (e.g., one plane includes sub-planes 0 and 1 and another plane includes sub-planes 2 and 3). Individual memory elements (not shown) between adjacent physical partitions store data values, which may be read or written by applying a voltage generated by charge pumps 202-204. In other examples, the number, type, configuration, and properties of partitions, sub-blocks, and planes may be varied and are not limited to the example shown.

Here, charge pumps 202-204 generate voltages that are switched through switches 240-247 to memory elements between physical partitions 206-236. When applied, the voltage changes the resistive state of the element to store a data value, which may be indicative of a "0" or "1" or other values if intermediary resistive states are used (e.g., indicative of "00," "01," "10" or "11"). "Writing" is the process of changing the resistive state (measured at the read voltage), regardless of whether the change is from a high resistance to a low resistance or a low resistance to a high resistance. Power is driven to system 200 using voltages generated by charge pumps 202-204 and applied to physical partitions 206-236. When applied, voltages change the conductivity profile of a memory element, which may be implemented as stacks of material deposited at the intersection of a row and column electrodes (not shown), thus enabling a binary value to be read or written. Logic (not shown) coupled to charge pumps 202-204 directs the application of voltages to elements in physical partitions 206-236. Switches 240-247 may be activated in order to direct a voltage to a desired partition to read or write data. By using charge pumps 202-204 and a memory array having physical partitions 206-236, operations such as reads and writes may be performed simultaneously without using charge pump circuitry designed for the output of large voltages. In some examples, voltages may be generated and independently "gated" (i.e., routed or switched to a particular element) through switches 240-247 to physical partitions 206-236.

Charge pump B 204 provides a positive driving voltage to switches 240, 242, 244 and 246, which gate driving voltages to the desired elements based on the appropriate X and Y coordinates. Charge pump A 202 provides negative driving voltages through switches 241, 243, 245 and 247, which gate driving voltages to the desired elements based on the appropriate X and Y coordinates. When charge pump A 202 and charge pump B 204 simultaneously output voltages of opposite polarities, the total voltage drop across the memory element can be higher than the output of either charge pump 202 and 204. Typically, the total voltage drop across the memory element would need to be one polarity to write in one direction (e.g., from low resistance to high resistance) and an opposite polarity to write in the opposite direction (e.g., from high resistance to low resistance). For example, if a memory element between physical partitions 208 and 216 needed to write the equivalent of a "1" value over an existing "0", switch 242 would apply the output of charge pump B 204 to physical partition 208 while switch 243 would apply the output of charge pump A 202 to physical partition 216. However, if the same memory element needed to write the equivalent of a "0" value over an existing "1", then switch 243 would apply the output of charge pump A 202 to physical partition 208 while switch 242 would apply the output of charge pump B 204 to physical partition 216. The use of multiple charge pumps that are independently gated allows multiple simultaneous operations to be performed on memory elements in different sub-blocks. Further, by using multiple charge pumps with a third dimension memory array, simultaneous reads and writes may be performed without increasing die size. Other components, input and output voltages, and circuit and component descriptions may be used and are not limited to those described above.

Figure 2B:
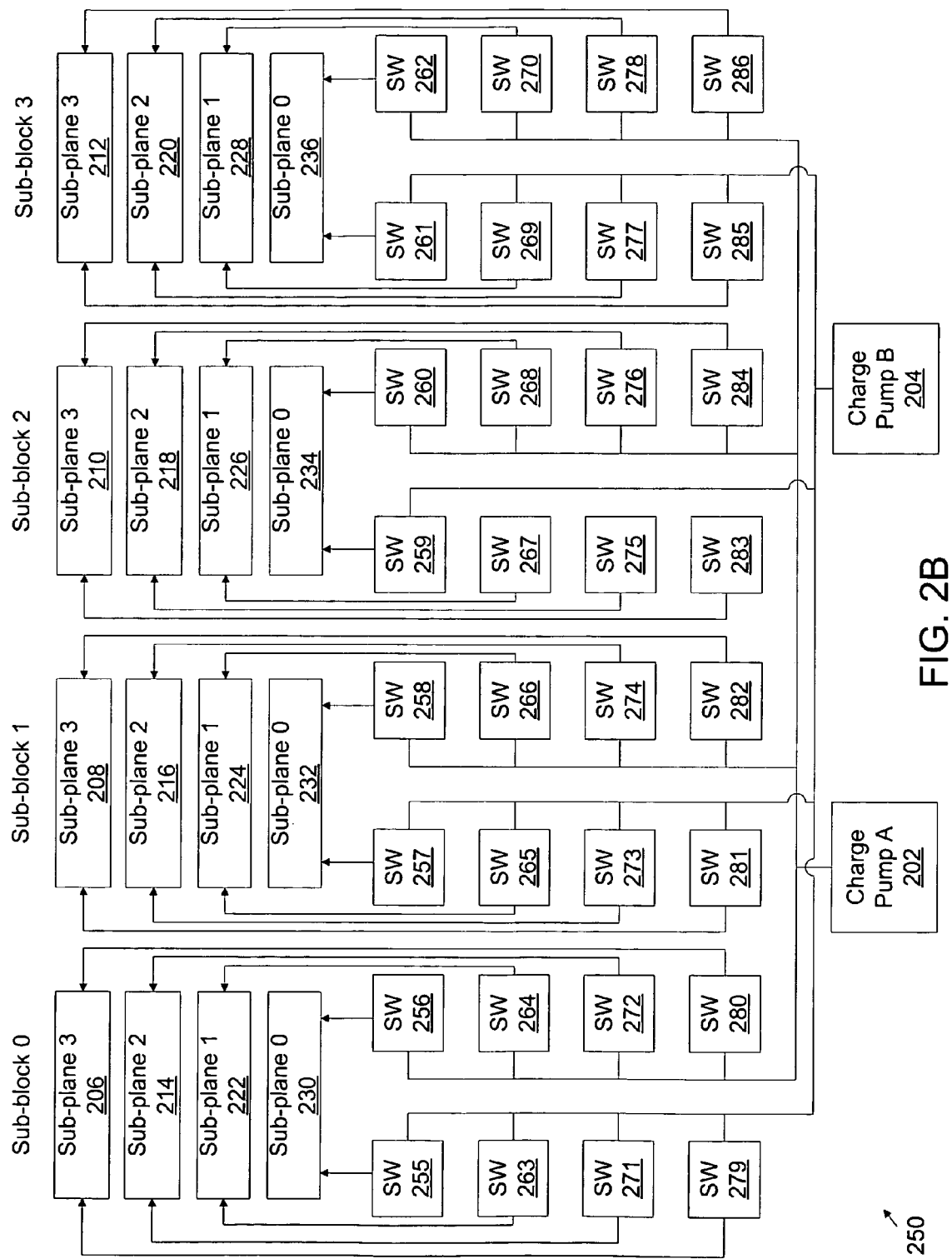
FIG. 2B illustrates an alternative exemplary memory power management system.

FIG. 2B illustrates an alternative exemplary memory power management system. Similar to system 200 described above in connection with FIG. 2A, system 250 includes charge pumps 202-204 and physical partitions 206-236. However, each physical partition 206-236 has a dedicated pair of switches 255-286, instead of the design illustrated in FIG. 2A in which each sub-block had a dedicated pair of switches 240-247. In other words, the "logical partitions" that can be independently controlled are sub-blocks in FIG. 2A and physical partitions in FIG. 2B. Each switch in a pair gates voltages to a partition based on X and Y coordinates. By using X and Y coordinates, an element disposed at the intersection of two conductive array lines (e.g., the intersection of a pair of row and column electrodes) may be located within an array, whether in a block, sub-block, or any other type of partition. For example, switches 273-274 are used to gate driving voltages from charge pumps 202-204 to one or more locations within physical partition 216, which lies in sub-plane 2 and sub-block 1 of the memory array. Switches 255-286 gate voltages based on an X and Y coordinate pair assigned to each location within physical partitions 206-236. By using X and Y coordinates, sub-blocks, sub-planes, partitions, and memory elements, may be located and accessed to perform operations. Logic (not shown) coupled to system 250 determines which memory element is being requested for access to perform a desired read or write operation or other programmable sequence. Based upon that determination, charge pumps 202-204 are directed to generate driving voltages that are sent to a memory element or group of memory elements electrically connected to physical partitions 206-236. For example, if a memory element between physical partitions 208 and 216 needed to write a "1", switch 281 would apply the output of charge pump B 204 to physical partition 208 while switch 274 would apply the output of charge pump A 202 to physical partition 216. Switches 273 and 282 would be turned off. However, if the same memory element needed to write a "0", then switches 281 and 274 would be turned off while switch 282 would apply the output of charge pump A 202 to physical partition 208 while switch 273 would apply the output of charge pump B 204 to physical partition 216.

In both FIG. 2A and FIG. 2B multiple charge pumps that are independently gated allow more than one programmable sequence to be performed simultaneously. However, it should be appreciated that it may not be desirable to execute a programming sequence on all available partitions. For example, in FIG. 2A, if only the memory elements in sub-blocks 1 and 2 needed to be modified, then only switches 242-245 would be active.

Figure 3:
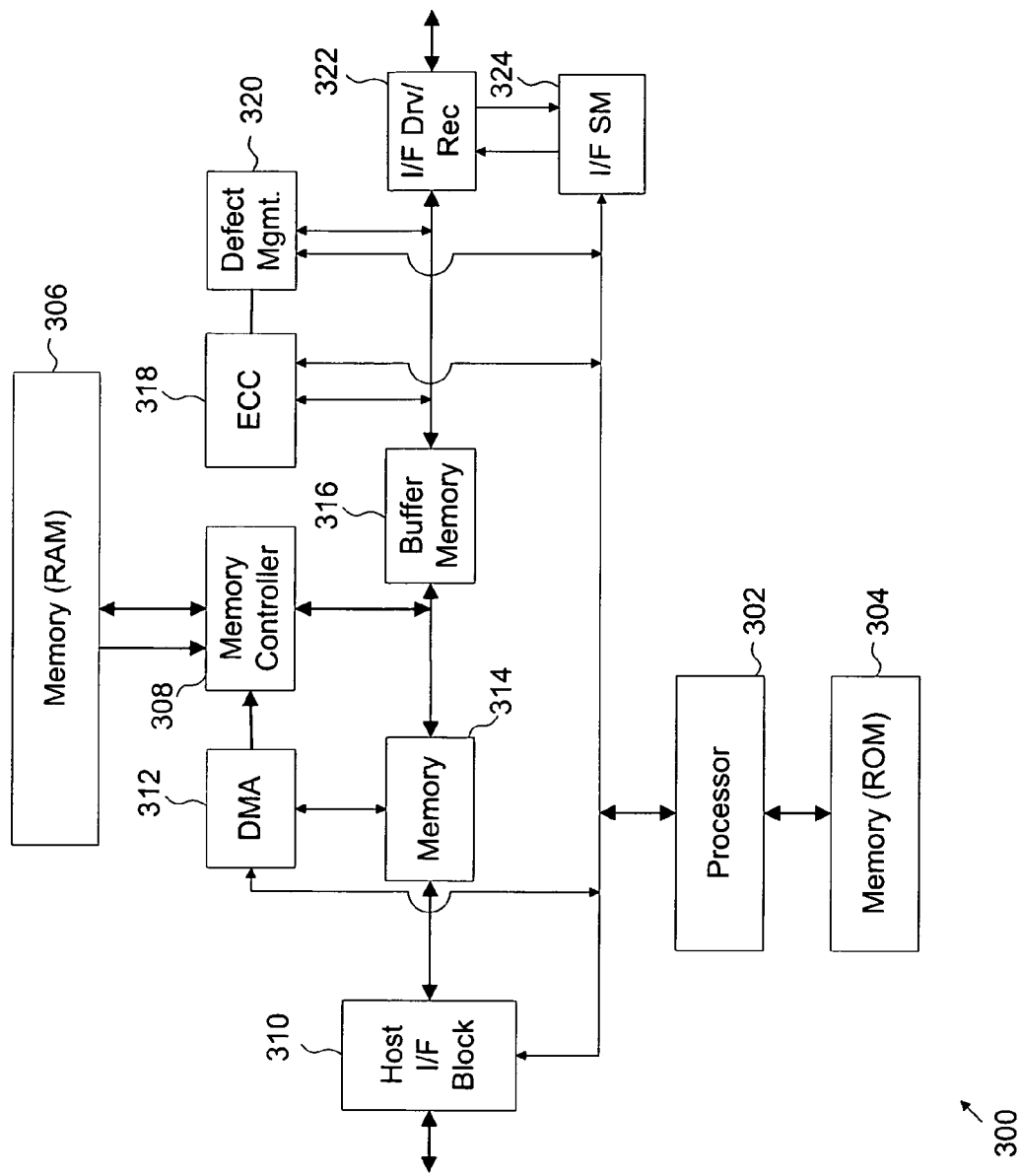
FIG. 3 illustrates an exemplary memory control system suitable for memory power management.

FIG. 3 illustrates an exemplary memory control system suitable for memory power management. System 300 enables data to be stored and retrieved from various memory locations and may be used to provide control logic with memory systems such as those described above in connection with FIGS. 2A-2B. Here, system 300 includes processor 302, memory (e.g., read only memory or ROM) 304, memory (e.g., random access memory or RAM) 306, memory controller 308, host interface (I/F) block 310, direct memory access (DMA) block 312, memory 314, buffer memory 316, error correction code (which may also be referred to as error checking and correction or ECC) 318, defect management block 320, interface driver/receiver 322, and interface (I/F) state machine (SM) 324. Memory implementations in system 300 may be implemented as RAM, ROM, dynamic random access memory (DRAM), static/dynamic random access memory (SDRAM), and others. Buffer memory 316 may be implemented to temporarily store and access data while system 300 is operating (i.e., receiving power) enabling faster data processing. In some examples, buffer memory 316 may be implemented as a first-in, first-out (FIFO) buffer. In other examples, buffer memory 316 may be implemented differently. Other components are described, including logic for controlling operations that access memory locations throughout system 300.

The various modules included in system 300 may be used to implement functionality for a storage system that interfaces with memory systems and other external systems that either request or store data in system 300. External systems may include other software or hardware that, through I/F Drv/Rec 322, interfaces with system 300 to retrieve or store data. In other examples, more or fewer modules may be included in system 300. Further, different modules may be used to implement various types of functionality beyond that described above.

Here, processor 302 provides logic configured to provide controller functions. Software code written in languages such as C may provide instruction sets on how system 300 processes requests to either retrieve or store data from various memory locations in system 300. Other functions performed by processor 302 may include initializing controller logic when power is applied (i.e., "on" voltage is applied), performing diagnostic checks, interpreting commands for memory functions, memory management, ECC-related functions, and others. Processor 302 also interprets commands from host I/F 310 to establish data flow control using DMA 312. Host I/F 310 may be used to implement complex functionality that enables system 300 to integrate with other systems, for example, in a computer. Some functions that may be performed by host I/F 310 include encoding/decoding (e.g., 8-bit/10-bit), scrambling (to reduce electromagnetic interference (EMI)), parity/cyclic redundancy check (CRC)/ECC checking, disparity generation and checking, interface state machine functions, data buffer (e.g., first-in, first-out (FIFO)), alignment and primitive check and generation (e.g., checks performed on serial interfaces), and others. Some of these functions may also be implemented using other modules with system 300.

In some examples, system 300 may be implemented as a memory card, including memory storage and controller logic. A memory card may be connected to host I/F 310 using an interface connector (not shown). A chip using system 300 may be configured to receive electrical signals from external devices through an interface connector. The electrical signals are interpreted and acted upon depending upon an interface standard (e.g., IEEE) used for command and data passing. Electrical signals may be sent and received to pass data to and from memory 306 via host I/F 310 and memory controller 308. Host I/F 310 sends commands and data to memory 306 via DMA 312 and memory controller 308. In some examples, memory controller 308 may be implemented as a DRAM controller, which may be used to access, retrieve, and store data in memory 306 while power is being supplied. Memory controller 308 also determines addresses for data stored in memory 306. Addresses may be referenced, for example, based on a row and column reference for a particular memory element in a given memory array. By selectively applying voltages to terminals connected to row and column leads, the resistive states of memory elements may be changed. The resistive states of memory elements may be changed to store binary data bits (e.g., whether a memory element's resistive state indicates a "0" or "1"). This "memory effect" applies to the various memory configurations described. In some examples, modules within system 300 may be third dimension memory. For example, memory 304 or memory 306 or other memory locations may be implemented as non-volatile third dimension memory.

Here, system 300 may use multiple memory controllers to enable faster data retrieval and storage from various memory locations. In some examples, DRAM technology may be used to implement memory 306 and memory controller 308. DRAM uses a "pulse" or "refresh" voltage to retain data in memory while power is on. Memory controller 308 may be implemented using logic that processes data stored in and retrieved from memory 306. In some examples, multiple DRAM-based memory controllers may be used in order to increase processing times. In still other examples, multiple DRAM layers may be used to increase storage capacity. System 300 may also include logic that determines how data is shared with external devices.

In some examples, I/F SM 324 may be configured to send or receive data from an external device indicated by addresses in electrical signals. A "handshake" may be performed with the indicated external device through I/F Dev/Rec module 322, which acts as a memory interface bus to establish a connection. After establishing a connection between the device and system 300 (via I/F Drv/Rec module 322), data may be passed between memory 304, 306, or 314 (via buffer memory 316) to the indicated device. I/F Dev/Rec module 322 works in conjunction with I/F SM 324, which performs handshaking and data flow handling to external devices using data in memory 304 or 306 controlled by system 300. I/F SM 324 may also include other functionality to support interfaces between system 300 and external devices. Devices may also include other processes, logic, circuits, components, or functionality included in an IC.

Figure 4A:
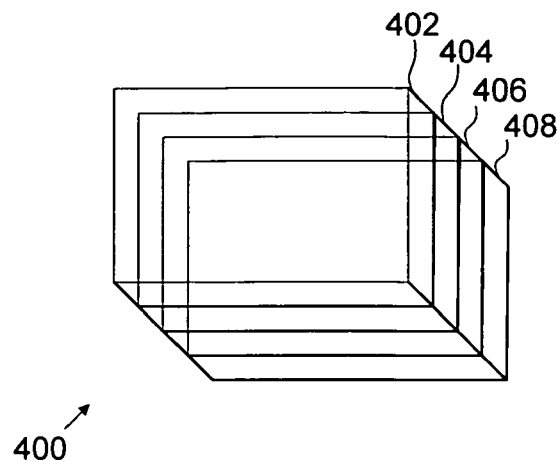
FIG. 4A illustrates an exemplary memory system configuration suitable for memory power management.

FIG. 4A illustrates an exemplary memory system configuration suitable for implementing memory power management. In some examples, memory systems may be developed using third dimension memory. Here, system 400 is an example of a vertical configuration of layers 402-408. Each layer may be divided into n sub-planes. By dividing each layer into sub-planes, functionality in a third dimension memory may be tailored by using layers for different purposes while using a small die size. Metal or other materials may be used as conductive conduits that enable electrical current to flow between the memory array layers as "vias" or "thrus." For example, vias, thrus and conductive array lines may be used to retrieve data from a particular memory element in a memory array implemented at layer 402. Controller logic implemented at layer 408, based on an address (e.g., X and Y coordinates) for the desired memory element in the memory array, retrieves data stored at the memory array layer by sending an electrical current to determine the resistive state of the memory element (e.g., one resistive state may be interpreted as a "0" and another resistive state may be interpreted as a "1").

Vertical configurations enable additional functionality without using large die sizes or incurring expensive testing methods and facilities for either combined controller/memory or separate controller and memory systems. Various types of functionality or circuitry may be used beyond those described above and are not limited to the examples shown.

Figure 4B:
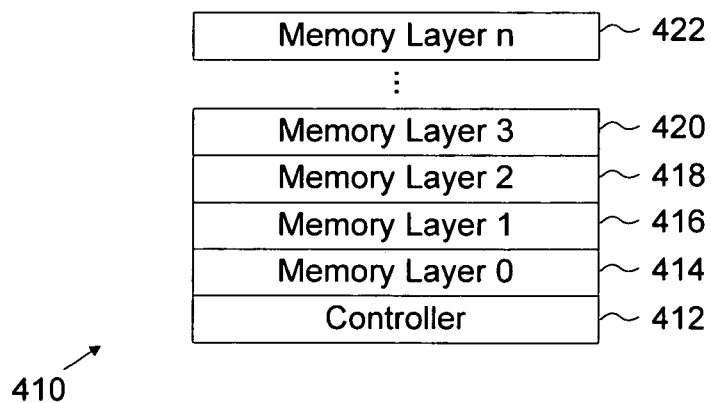
FIG. 4B is an alternative view of an exemplary memory system configuration suitable for memory power management.

FIG. 4B is an alternative view of an exemplary memory system configuration suitable for memory power management. In some examples, system 410 includes controller 412, which is vertically configured with n memory array layers 414-422. In other examples, the number of memory array layers 414-422 may be modified to include more or fewer layers than those shown. Additional functionality may also be implemented by controller 412, as described above.

Here, memory array layers 414-422 may be stacked in different numbers of layers to allow different circuit patterns of varying configurations to be implemented (i.e., printed) using a single mask set during fabrication. By increasing or decreasing the numbers of memory array layers, circuitry may be varied. For example, if a circuit having a small memory controller capacity is desired, a single memory layer may be implemented in a vertical stack during the fabrication process. If more capacity is desired, multiple memory array layers may be added until design and process constraints are reached. For example, although three (3) memory array layers are shown in system 400, any number of layers may be used.

Figure 4C:
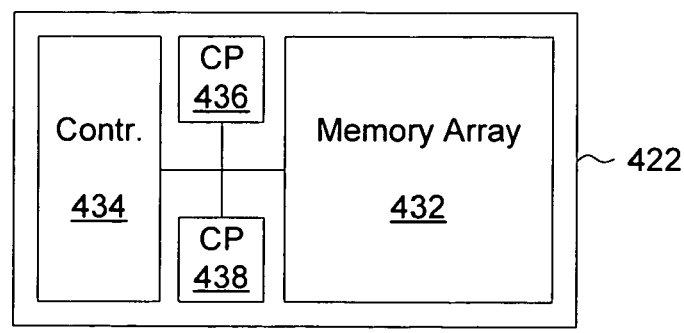
FIG. 4C is an exemplary die configuration suitable for memory power management.

FIG. 4C is an exemplary die configuration suitable for memory power management. Here, an alternative configuration of a memory system is shown. Substrate 422 includes memory array 432, controller 434, and charge pumps 436-438. Included on substrate 422 are various circuitry modules (e.g., memory array 432, controller 434, charge pumps 436-438, and the like) that may be printed or fabricated on, with, or integrated into substrate 422. In this example, an alternative die configuration may be used to illustrate the various types of components or circuitry that may be implemented onto a substrate. In some examples, circuitry may be integrated with memory array 432 in a vertically-stacked configuration, providing a physically-reduced memory system footprint on substrate 422. However, various types and configurations of circuitry may be used and are not limited to the configuration shown with substrate 422.

Figure 5:
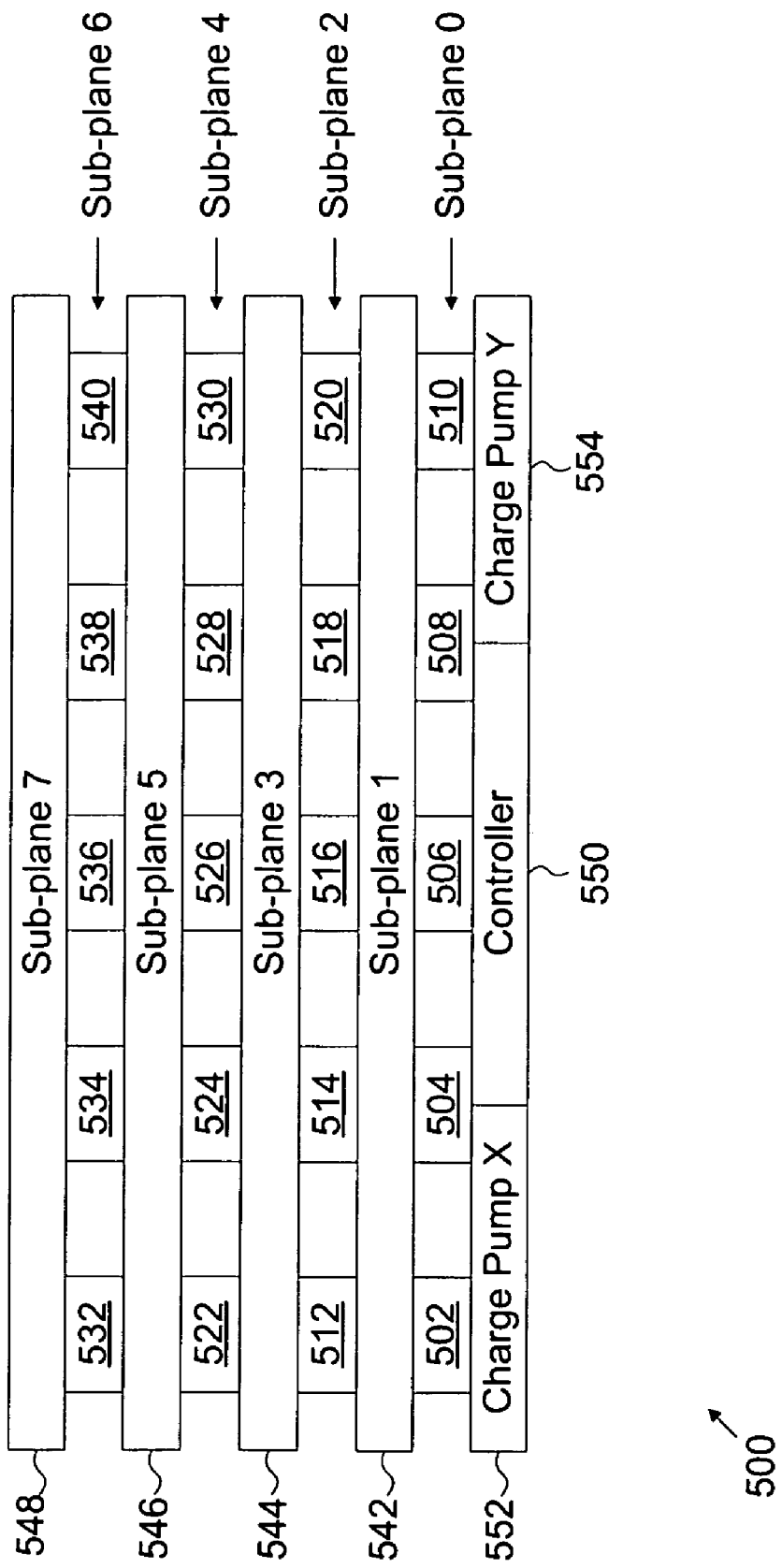
FIG. 5 is a cross-sectional view of an exemplary memory system suitable for memory power management.

FIG. 5 is cross-sectional view of an exemplary memory system using memory power management. Here, system 500 includes column electrodes 502-540, row electrodes 542-548, charge pump (X coordinate) 552, charge pump (Y coordinate) 554, and controller 550. In some examples, column electrodes 502-540 and row electrodes 542-548 are conductive array lines that are coupled by either direct or indirect connections (not shown) to each sub-plane of a memory array. Column electrodes 502-540, row electrodes 542-548, connections between both types of electrodes, and memory materials used for memory elements may be implemented using various types of conductive or semiconductive materials and are not limited to any particular type.

Column electrodes 502-510 are configured on sub-plane 0, column electrodes 512-520 are configured on sub-plane 2, column electrodes 522-530 are configured on sub-plane 4, and column electrodes 532-540 are configured on sub-plane 6. Likewise, row electrodes 542-548 are configured on odd-numbered sub-planes (e.g., 1, 3, 5, and the like). Other row electrodes may be disposed relative to row electrodes 542-548 and lying orthogonal to column electrodes 502-540. The intersections of row electrodes 542-548 and column electrodes 502-540 create a memory array and each intersection represents an element configured to store a data value (e.g., "0," "1"). In other examples, different configurations may be implemented other than those shown.

Here, charge pump (X coordinate) 552 and charge pump (Y coordinate) 554 are coupled to column electrodes 502-540 and row electrodes 542-548, respectively. In other examples, charge pump (X coordinate) 552 and charge pump (Y coordinate) 554 may be implemented differently, including using different circuit patterns, conductive materials, varying the number of layers used in system 500.

Figure 6:
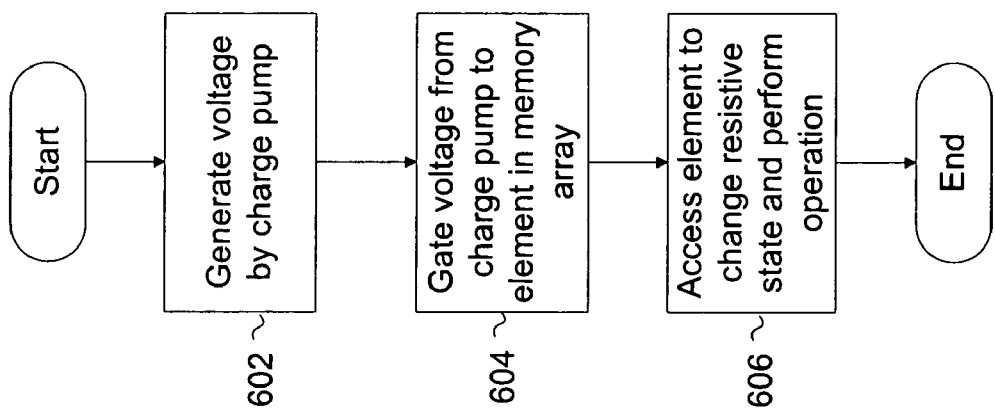
FIG. 6 is a flow chart illustrating an exemplary method for managing power.

FIG. 6 is a flow chart illustrating an exemplary method for managing power. In some examples, a driving voltage is generated by a pair of charge pumps in a memory system such as those described above (602). Once generated, the driving voltage is gated to a memory element in a memory array included in the memory system (604). The driving voltage may be independently gated or otherwise routed from the charge pumps to a desired memory element in the memory array. After gating the driving voltage to the desired element, an access and operation (e.g., read or write) is performed (606). Here, multiple charge pumps may be used to perform simultaneous accesses.

Figure 7:
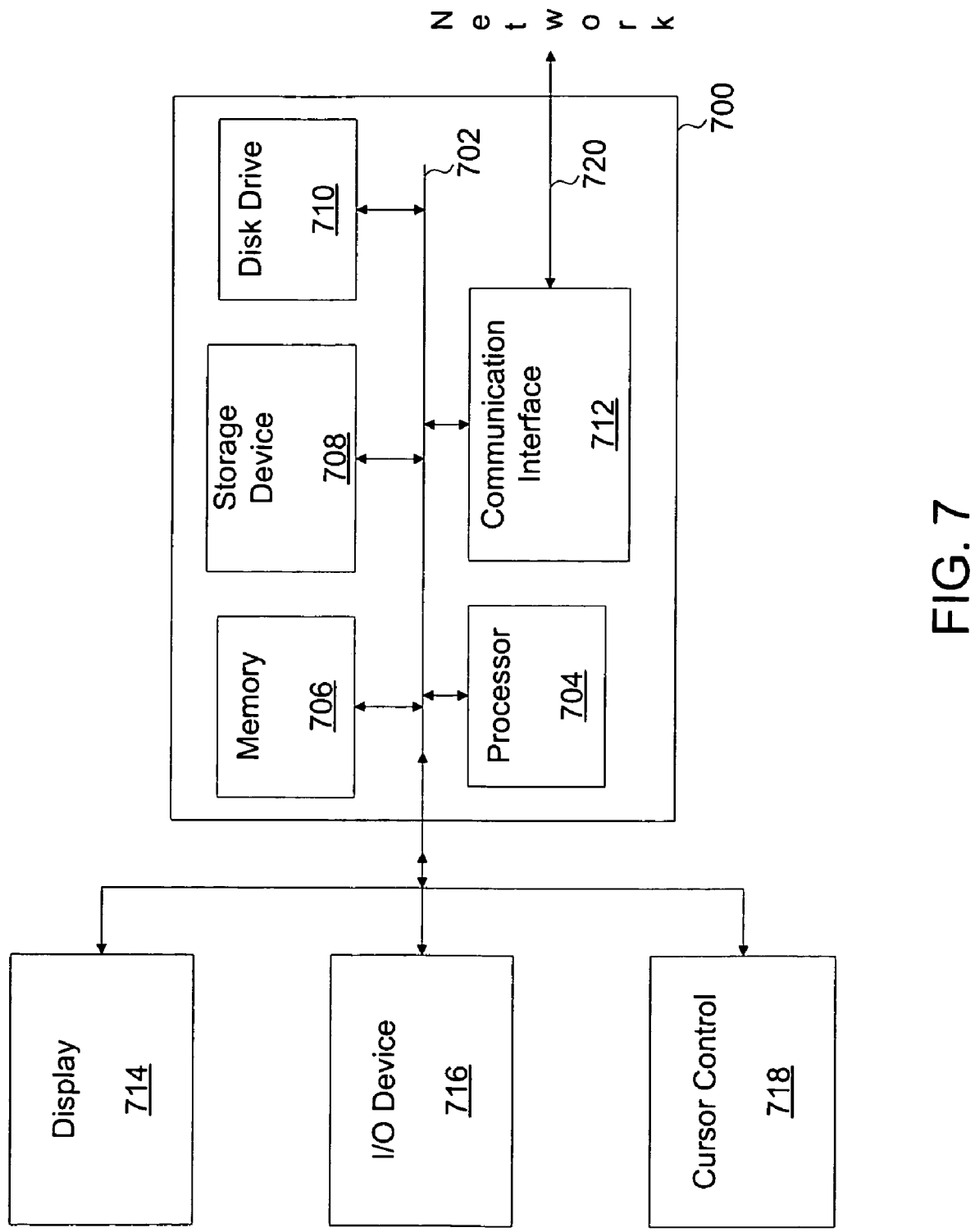
FIG. 7 is a block diagram illustrating an exemplary computer system suitable for memory power management.

FIG. 7 is a block diagram illustrating an exemplary computer system suitable for memory power management. In some examples, computer system 700 may be used to implement computer programs, applications, methods, or other software to perform the above-described techniques. Computer system 700 includes a bus 702 or other communication mechanism for communicating information, which interconnects subsystems and devices, such as processor 704, system memory 706 (e.g., RAM), storage device 708 (e.g., ROM), disk drive 710 (e.g., magnetic or optical), communication interface 712 (e.g., modem or Ethernet card), display 714 (e.g., CRT or LCD), input device 716 (e.g., keyboard), and cursor control 718 (e.g., mouse or trackball).

According to some examples of the invention, computer system 700 performs specific operations by processor 704 executing one or more sequences of one or more instructions stored in system memory 706. Such instructions may be read into system memory 706 from another computer readable medium, such as static storage device 708 or disk drive 710. In some examples, hard-wired circuitry may be used in place of or in combination with software instructions to implement the invention.

The term "computer readable medium" refers to any medium that participates in providing instructions to processor 704 for execution. Such a medium may take many forms, including but not limited to, non-volatile media, volatile media, and transmission media. Non-volatile media includes, for example, optical or magnetic disks, such as disk drive 710. Volatile media includes dynamic memory, such as system memory 706. Transmission media includes coaxial cables, copper wire, and fiber optics, including wires that comprise bus 702. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

Computer system 700 may transmit and receive messages, data, and instructions, including program, i.e., application code, through communication link 720 and communication interface 712. Received program code may be executed by processor 704 as it is received, and/or stored in disk drive 710, or other non-volatile storage for later execution.

Although the invention has been described in its presently contemplated best mode, it is clear that it is susceptible to numerous modifications, modes of operation and embodiments, all within the ability and skill of those familiar with the art and without exercise of further inventive activity. There are many alternative ways of implementing the invention. For example, multiple charge pumps may be used to generate multiple voltage levels. Multiple voltage levels can be useful for intermediary resistive states. Multiple voltage levels can also be useful if programming voltages in one direction (e.g., low to high resistance) are of a different magnitude than programming voltages in the other direction (e.g., high to low resistance). The disclosed examples are illustrative and not restrictive. Accordingly, that which is intended to be protected by Letters Patent is set forth in the claims and includes all variations and modifications that fall within the spirit and scope of the claim.

What is claimed is:

1. A memory power management system, comprising:
a non-volatile rewritable memory array including a plurality of logical partitions, the memory array being configured in at least one memory plane, the memory array is fabricated above and is in contact with a substrate, the substrate including circuitry components fabricated on the substrate and positioned below the memory array and an interconnect structure operative to electrically couple the circuitry components with the memory array, the memory array including
  memory cells, each memory cell including an electrolytic tunnel barrier and a mixed valence conductive oxide;
at least two charge pumps included in the circuitry components and electrically coupled with the non-volatile rewritable memory array, wherein one charge pump provides a positive voltage and another charge pump provides a negative voltage; and
logic configured to control delivery of the voltages generated by the at least two charge pumps to each logical partition such that each logical partition is controlled independently of each other logical partition.

2. A memory power management system, comprising:
a non-volatile rewritable memory array including a plurality of logical partitions, the memory array being configured in at least one memory plane, the memory array is fabricated above and is in contact with a substrate, the substrate including circuit components fabricated on the substrate and positioned below the memory array and an interconnect structure operative to electrically couple the circuitry components with the memory array;
at least two charge pumps included in the circuitry components and electrically coupled with the non-volatile rewritable memory away, wherein one charge pump provides a positive voltage and another charge pump provides a negative voltage; and
logic configured to control delivery of the voltages generated by the at least two charge pumps to each logical partition such that each logical partition is controlled independently of each other logical partition, wherein the memory array is configured in at least two sub-planes, the sub-planes being configured to receive voltages generated by the at least two charge pumps, and the logic selects which sub-plane receives which voltage for each partition.

3. A memory power management system, comprising:

a memory being configured into one or more vertically-stacked memory planes that are in contact with and are fabricated aver a substrate including circuitry fabricated on the substrate and electrically coupled with the one or more vertically-stacked memory pianos, each memory plane having one or more partitions, each partition having exactly two sub-planes and a plurality of memory elements disposed in between the two sub-planes;

a charge pump circuit vertically disposed below the memory and is included in the circuitry fabricated on the substrate and electrically coupled with the memory, the charge pump circuit being configured to deliver at least two voltages; and a logic circuit electrically coupled with the charge pump circuit and the memory, the logic circuit being configured to control the memory by, for each sub-plane, directing one of the at least two voltages delivered by the charge pump circuit to a selected sub-plane.

4. The memory power management system of claim 3, wherein the charge pump circuit includes exactly two charge pumps.

5. The memory power management system of claim 3, wherein the memory comprises a non-volatile memory array.

6. The memory power management system of claim 3, wherein the memory comprises a non-volatile, two-terminal, cross-point, third dimension memory array.

7. The memory power management system of claim 6, wherein the logic circuit being configured such that each sub-plane can receive any of the at least two voltages but cannot receive the at least two voltages simultaneously.

8. The memory power management system of claim 6, wherein the logic circuit is vertically disposed below the memory and is included in the circuitry fabricated on the substrate.

9. The memory power management system of claim 6, wherein each memory element includes an electrolytic tunnel barrier and a mixed valence conductive oxide, and at least one of the at least two voltages, when applied to the memory element, changes a conductivity profile of the memory element.

* * * * *

UNITED STATES PATENT AND TRADEMARK OFFICE
CERTIFICATE OF CORRECTION

PATENT NO. : 7,619,945 B2
APPLICATION NO. : 11/506385
DATED : November 17, 2009
INVENTOR(S) : Robert Norman It is certified that error appears in the above-identified patent and that said Letters Patent is hereby corrected as shown below:

1. In independent Claim 2, in Column 10, Line 55, please Replace the misspelled word "circuit" with the correct word "circuitry".

2. In independent Claim 3, in Column 11, Line 9, please Replace the misspelled word "aver" with the correct word "over".

3. In independent Claim 3, in Column 11, Line 11, please Replace the misspelled word "pianos" with the correct word "planes".

Signed and Sealed this

Ninth Day of February, 2010

David J. Kappos
*Director of the United States Patent and Trademark Office*